(12) United States Patent
Anthony et al.

(10) Patent No.: US 6,172,904 B1
(45) Date of Patent: Jan. 9, 2001

(54) MAGNETIC MEMORY CELL WITH SYMMETRIC SWITCHING CHARACTERISTICS

(75) Inventors: Thomas C. Anthony, Sunnyvale; Manoj K Bhattacharyya, Cupertino, both of CA (US)

(73) Assignee: Hewlett-Packard Company, Palo Alto, CA (US)

( * ) Notice: Under 35 U.S.C. 154(b), the term of this patent shall be extended for 0 days.

(21) Appl. No.: 09/492,260

(22) Filed: Jan. 27, 2000

(51) Int. Cl.$^7$ ................................................ G11C 11/15
(52) U.S. Cl. ............................................ 365/173; 365/171
(58) Field of Search .................................. 365/173, 171; 257/295; 360/113, 131

(56) References Cited

U.S. PATENT DOCUMENTS

| | | | |
|---|---|---|---|
| 5,715,121 | * 2/1998 | Sakakima et al. | 365/173 |
| 5,768,183 | * 6/1998 | Zhu et al. | 365/173 |
| 5,953,248 | * 9/1999 | Chen et al. | 365/173 |
| 5,982,660 | * 11/1999 | Bhattacharya et al. | 365/173 |
| 6,072,717 | * 6/2000 | Brug et al. | 365/173 |

\* cited by examiner

*Primary Examiner*—Tan T. Nguyen

(57) ABSTRACT

A magnetic memory cell with symmetric switching characteristics includes a sense layer and a reference layer coupled to the sense layer through a barrier layer. The magnetic memory cell further includes an additional reference layer coupled to the sense layer through a spacer layer. The additional reference layer is formed so that a set of demagnetization and coupling fields from the additional reference layer balance a set of demagnetization and coupling fields from the reference layer.

26 Claims, 3 Drawing Sheets

MAGNETIC MEMORY CELL WITH SYMMETRIC SWITCHING CHARACTERISTICS

BACKGROUND OF THE INVENTION

1. Field of Invention

The present invention pertains to the field of magnetic memories. More particularly, this invention relates to a magnetic memory cell with substantially symmetric switching characteristics.

2. Art Background

A magnetic memory such as a magnetic random access memory (MRAM) typically includes an array of magnetic memory cells. Each magnetic memory cell usually includes a sense layer and a reference layer. The sense layer is usually a layer of magnetic material that stores magnetization patterns in orientations that may be altered by the application of magnetic switching fields. The reference layer is usually a layer of magnetic material in which the magnetization is fixed or "pinned" in a particular direction.

The logic state of a magnetic memory cell typically depends on its resistance to electrical current flow. The resistance of a magnetic memory cell usually depends on the relative orientations of magnetization in its sense and reference layers. A magnetic memory cell is typically in a low resistance state if the overall orientation of magnetization in its sense layer is parallel to the orientation of magnetization in its reference layer. In contrast, a magnetic memory cell is typically in a high resistance state if the overall orientation of magnetization in its sense layer is anti-parallel to the orientation of magnetization in its reference layer.

Such a magnetic memory cell is usually written to a desired logic state by applying magnetic switching fields that rotate the orientation of magnetization in the sense layer. It is usually desirable to form a magnetic memory cell so that a magnetic switching field of a predictable magnitude in one direction switches it to its low resistance state and a magnetic switching field of a predictable magnitude in the opposite direction switches it to its high resistance state. Such switching behavior may be referred to as symmetric switching characteristics. Unfortunately, a variety of effects commonly found in prior magnetic memory cells create asymmetric switching characteristics.

For example, the reference layer in a typical prior magnetic memory cell generates demagnetization fields that push the magnetization in the sense layer toward the anti-parallel orientation. These demagnetization fields usually increase the threshold magnitude of the magnetic switching field needed to rotate the sense layer to the low resistance state and decrease the threshold magnitude of the magnetic switching field needed to rotate the sense layer to the high resistance state. This typically increases the power needed to write the magnetic memory cell to the low resistance state and may cause accidental writing to the high resistance state. In extreme cases, these demagnetization fields may cause a magnetic memory cell to remain in the high resistance state regardless of the applied magnetic switching fields.

In addition, coupling fields between the reference layer and the sense layer in a typical prior magnetic memory cell push the magnetization in the sense layer toward the parallel orientation. These coupling fields usually increase the power needed to write the magnetic memory cell to the high resistance state and may cause accidental writing to the low resistance state. In extreme cases, these coupling fields may cause a magnetic memory cell to remain in the low resistance state regardless of the applied magnetic switching fields.

Moreover, the degree of disruption to sense layer magnetization from demagnetization and coupling fields may vary among the magnetic memory cells in an MRAM array and may vary between different MRAM arrays due to variation in the patterning steps and/or deposition steps of device manufacture. Such variations typically produce uncertainty as to the behavior of individual magnetic memory cells during write operations.

SUMMARY OF THE INVENTION

A magnetic memory cell with symmetric switching characteristics is disclosed. The magnetic memory cell includes a sense layer and a reference layer coupled to the sense layer through a barrier layer. The magnetic memory cell further includes an additional reference layer coupled to the sense layer through a spacer layer. The additional reference layer is formed so that a set of demagnetization and coupling fields from the additional reference layer balance a set of demagnetization and coupling fields from the reference layer.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
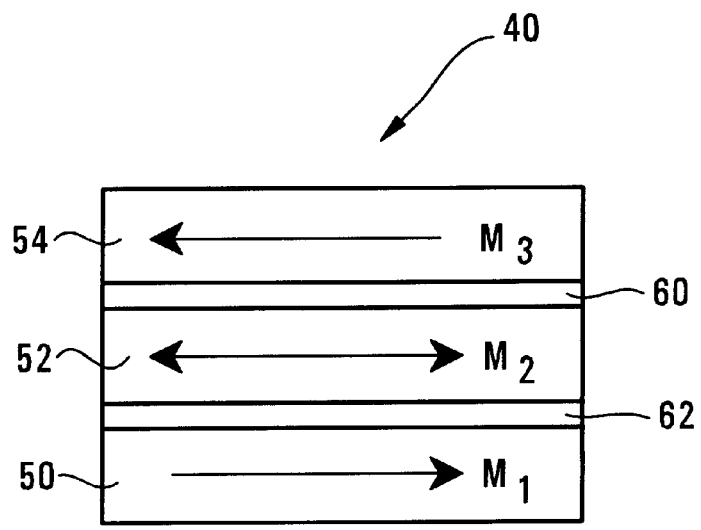
FIG. 1 illustrates a magnetic memory cell having symmetric switching characteristics according to the present teachings.

FIG. 1 illustrates a magnetic memory cell 40 having symmetric switching characteristics according to the present teachings. The magnetic memory cell 40 includes a sense layer 52 that holds an alterable magnetization state (M2) and a reference layer 50 having a pinned orientation of magnetization (M1) and an additional reference layer 54 having a pinned orientation of magnetization (M3). The thicknesses of the reference layers 50 and 54 and the orientations M1 and M3 are selected to balance the effects of demagnetization and coupling fields within the sense layer 52. In this embodiment, the magnetic memory cell 40 includes a barrier 62 between the sense layer 52 and the reference layer 50 and a spacer 60 between the sense layer 52 and the reference layer 54.

The thicknesses of the reference layers 50 and 54 and the orientations M1 and M3 are selected so that the demagnetization field from the reference layer 54 is substantially equal in magnitude to the demagnetization field from the reference layer 50 but opposite in direction within the sense layer 52. This may be achieved, for example, by pinning the orientation of magnetization M3 in the reference layer 54 opposite to the pinned orientation of magnetization M1 of the reference layer 50 and forming the reference layers 50 and 54 with substantially equal thicknesses.

It is known that the magnitude of coupling field between the reference layer 54 and the sense layer 52 and the magnitude of coupling field between the reference layer 50 and the sense layer 52 are a function of roughness at the corresponding interfaces between layers. The sense layer 52 is made to be very thin, less than 10 nanometers in some embodiments, and the layers 60 and 62 are even thinner so that the roughness at the interfaces between these layers tends to replicate through the structure. As a consequence, the roughness of the interfaces between the reference layer 50, the barrier 62, and the sense layer 52 is substantially similar to the roughness of the interfaces between the reference layer 54, the spacer 60, and the sense layer 52. Therefore, the coupling field from the reference layer 54 that acts on the sense layer 52 is substantially similar in magnitude to the coupling field from the reference layer 50 that acts on the sense layer 52 but in an opposite direction because M1 and M3 are in opposite directions. The net result is that these coupling fields reduce or substantially cancel one another.

The thicknesses of the reference layers 50 and 54 may be made unequal to achieve a balance in the fields that act on the sense layer 50.

The magnetic memory cell 40 may be a spin tunneling device in which an electrical charge migrates through the tunnel barrier 62 during read operations. This electrical charge migration through the tunnel barrier 62 occurs when a read voltage is applied to the magnetic memory cell 40. The tunnel barrier 62 may be a layer of insulating material such as aluminum-oxide less than 10 nanometers thick.

The spacer 60 may be a conductor such as copper having a thickness of between 10 and 50 angstroms or may be an insulator such as aluminum-oxide. The sense layer 52 may be a layer of soft magnetic material such as nickel-iron, nickel-iron-cobalt, or nickel-iron with a ferromagnetic material at its interfaces to enhance magneto resistance. The reference layers 50–54 may be soft magnetic material such as nickel-iron or nickel-iron-cobalt or similar material with its magnetization pinned by an adjacent antiferromagnetic layer.

Alternatively, the spacer 60 may be an insulator such as aluminum-oxide having a thickness between 5 and 30 angstroms. In this embodiment, a second tunnel junction in the magnetic memory cell 40 is in series with the primary tunnel junction formed by the tunnel barrier 62.

Figure 2:
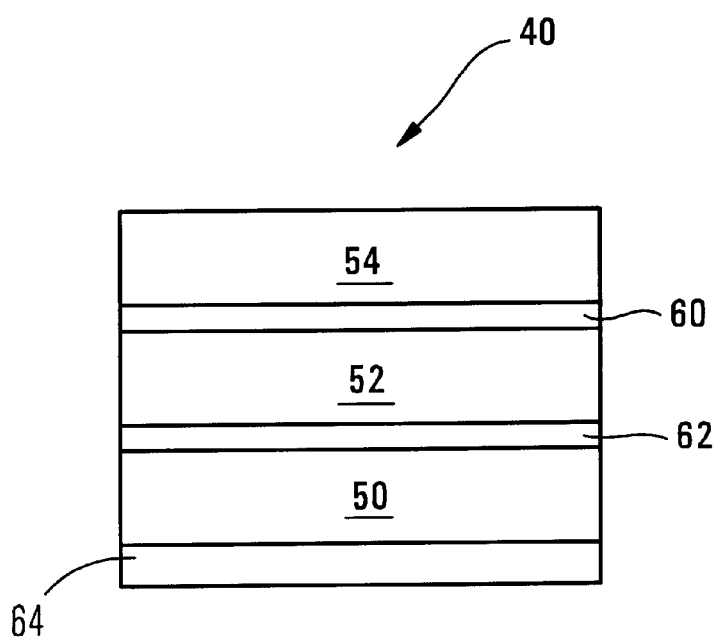
FIG. 2 shows one embodiment of a magnetic memory cell having symmetric switching characteristics according to the present teachings.

FIG. 2 shows one embodiment of the magnetic memory cell 40 having symmetric switching characteristics according to the present teachings. In this embodiment, the reference layer 50 is pinned by a layer 64 of antiferromagnetic material such as iron-manganese and the reference layer 54 is a permanent magnet material such as Co—Pt whose magnetization can be switched using a large external magnetic field. Alternatively, the reference layer 50 may be a permanent magnet and the reference layer 54 may be pinned by a layer of antiferromagnetic material. The antiferromagnetic material may be iron-manganese, nickel-manganese, iridium-manganese, or platinum-manganese, or a similar material.

Figure 3:
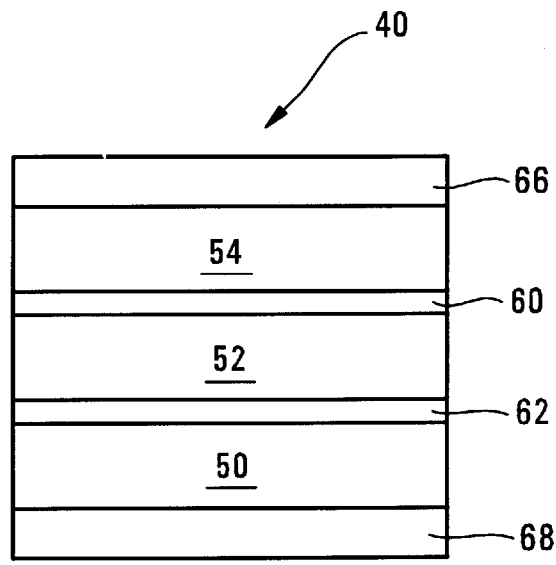
FIG. 3 shows another embodiment of a magnetic memory cell having symmetric switching characteristics according to the present teachings.

FIG. 3 shows another embodiment of the magnetic memory cell 40 having symmetric switching characteristics according to the present teachings. In this embodiment, the reference layer 54 is pinned by a layer 66 of antiferromagnetic material and the reference layer 50 is pinned by a layer 68 of antiferromagnetic material. The layers 66 and 68 have different blocking temperatures so that one layer is pinned upon lowering the temperature through the first blocking temperature and reversing the setting field before the temperature is lowered through the second blocking temperature.

During formation, the structure of the magnetic memory cell 40 shown is heated above the blocking temperature of both layers 66 and 68 and the magnetizations of the layers 50 and 54 are set parallel to M3 by applying an external magnetic field parallel to M3. Then the temperature is lowered below the blocking temperature of the layer 66 but above the blocking temperature of the layer 68 to establish a unidirectional anisotropy axis in the layer 54 in the direction of M3. The direction of the external magnetic field is then reoriented along the direction of M1. Then the temperature is lowered below the blocking temperature of the layer 68 to establish a unidirectional anisotropy axis in the layer 50 in the direction of M1.

Figure 4:
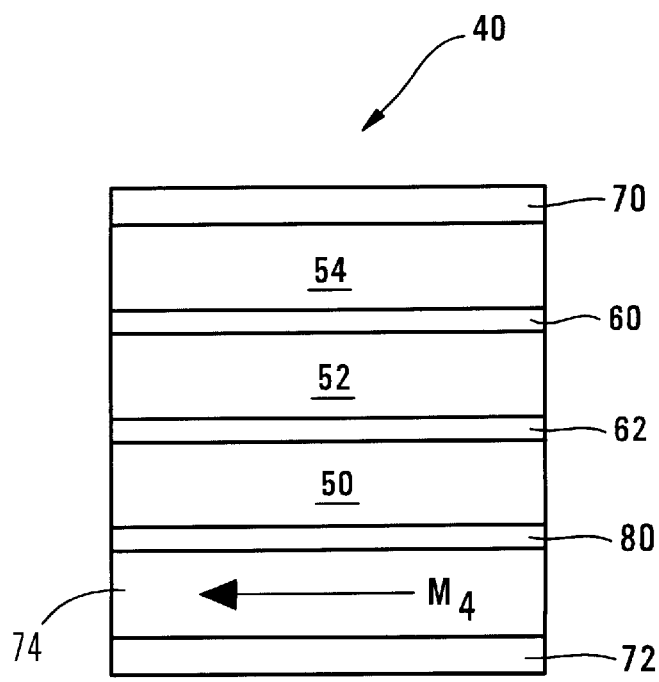
FIG. 4 shows yet another embodiment of a magnetic memory cell having symmetric switching characteristics according to the present teachings.

FIG. 4 shows yet another embodiment of the magnetic memory cell 40 having symmetric switching characteristics according to the present teachings. In this embodiment, the magnetization of the reference layer 54 is pinned parallel to M3 by a layer 70 of antiferromagnetic material and the orientation of magnetization M1 in the reference layer 50 is set by antiferromagnetic coupling with a layer 74 of magnetic material through a spacer 80. The layer 74 has an orientation of magnetization M4 which is set by a layer 72 of antiferromagnetic material. The layer 74 may be a magnetic material such as cobalt-iron or nickel-iron. The antiferromagnetic coupling between the layer 50 and the layer 74 sets the desired orientation of M1 in the layer 50. The spacer 80 may be ruthenium between 4 and 10 angstroms thick. Materials such as Cr and Cu may also be used as the spacer 80.

The antiferromagnetic layers 70 and 72 establish unidirectional anisotropy axes in layers 54 and 74 in a direction defined by M4. Consequently, the layers 70 and 72 may be the same material such as iron-manganese, iridium-manganese, or nickel-manganese having the same blocking temperature. This embodiment does not require the heating and setting sequence for differing blocking temperatures as described above. The thickness of the layer 50 may be substantially equal to the thickness of the layer 54 plus the thickness of the layer 74 so that the demagnetization field from the layer 50 that affects the sense layer 52 balances the demagnetization fields from the layers 54 and 74 that affect the sense layer 52.

Figure 5:
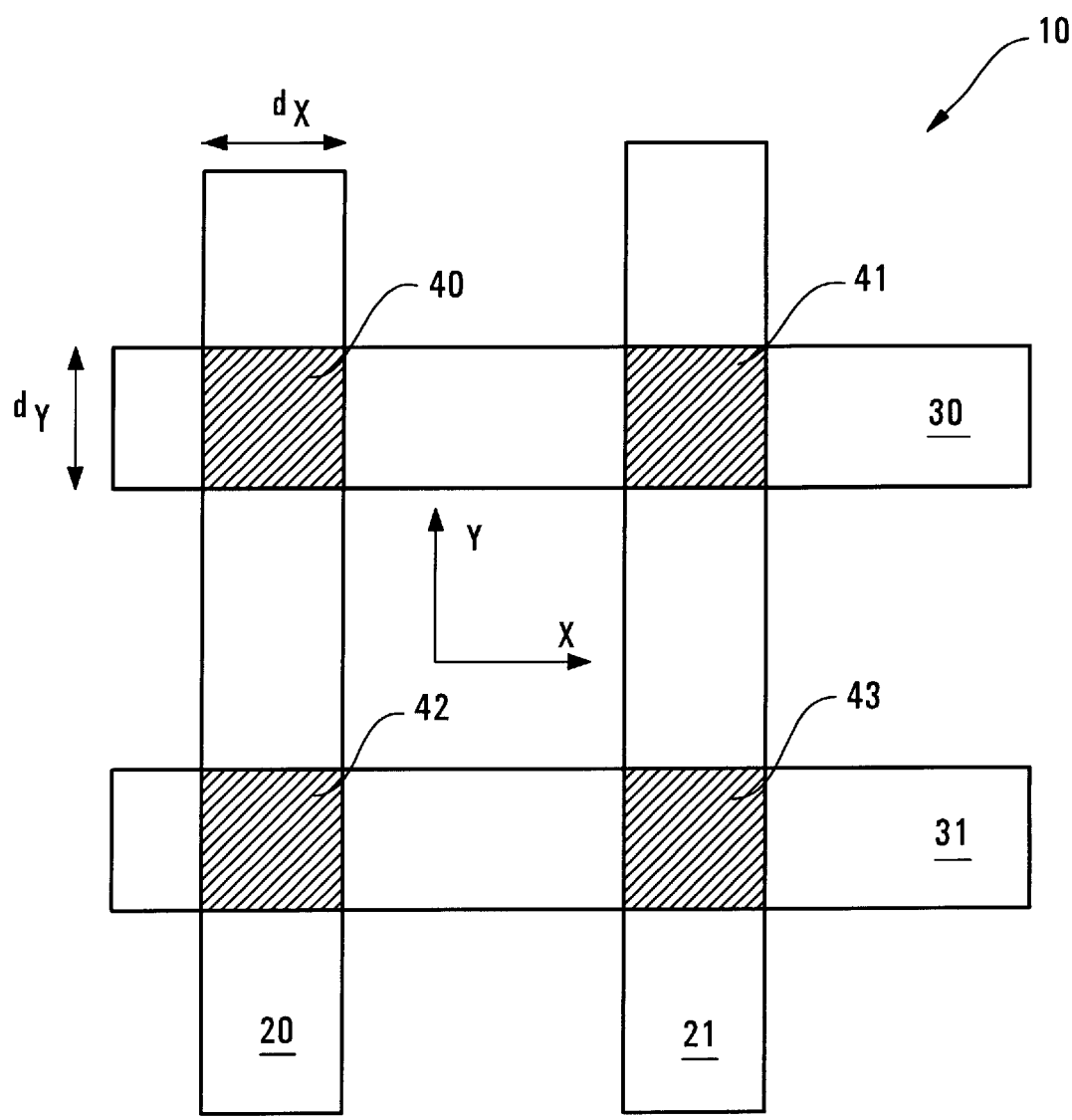
FIG. 5 is a top view of a magnetic memory which incorporates the present teachings.

FIG. 5 is a top view of a magnetic memory 10, an MRAM, which incorporates the present teachings. The magnetic memory 10 includes an array of magnetic memory cells including the magnetic memory cell 40 along with additional magnetic memory cells 41–43 each formed with structures described above that provide symmetric switching characteristics. The magnetic memory 10 includes an arrangement of conductors 20–21 and 30–31 that enable read and write access to the magnetic memory cells 40–43.

In one embodiment, the dimensions $d_x$ and $d_y$ of the magnetic memory cells 40–43 are selected to be substantially equal and form a square shape. The square shape enhances the density that may be obtained in an MRAM in comparison to that which may be obtained when using rectangular memory cells. This is so because for a given minimum feature size more square magnetic memory cells may be formed on a given substrate area than rectangular magnetic memory cells. In other embodiments, rectangular shapes may be used.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A magnetic memory cell, comprising:

sense layer;

reference layer coupled to the sense layer through a barrier layer;

additional reference layer coupled to the sense layer through a spacer layer such that a set of demagnetization and coupling fields from the additional reference layer balance a set of demagnetization and coupling fields from the reference layer.

2. The magnetic memory cell of claim 1, wherein the additional reference layer has a thickness which is preselected such that the demagnetization and coupling fields from the additional reference layer balance the demagnetization and coupling fields from the reference layer.

3. The magnetic memory cell of claim 1, further comprising a layer of antiferromagnetic material that pins an orientation of magnetization in the reference layer.

4. The magnetic memory cell of claim 3, wherein the additional reference layer comprises a permanent magnetic material having an orientation of magnetization substantially opposite to the orientation of magnetization in the reference layer.

5. The magnetic memory cell of claim 3, further comprising a layer of antiferromagnetic material that pins an orientation of magnetization in the additional reference layer substantially opposite to the orientation of magnetization in the reference layer.

6. The magnetic memory cell of claim 1, wherein the spacer layer is a layer of insulating material having a thickness of less than 10 nanometers.

7. The magnetic memory cell of claim 1, wherein the spacer layer is a layer of conductor material.

8. The magnetic memory cell of claim 1, wherein the barrier layer is a layer of insulating material having a thickness of less than 10 nanometers.

9. The magnetic memory cell of claim 1, further comprising:

a layer of antiferromagnetic material that pins the an orientation of magnetization in the additional reference layer;

a layer of magnetic material separated from the reference layer by an additional spacer layer;

a layer of antiferromagnetic material that pins an orientation of magnetization in the layer of magnetic material substantially parallel to the orientation of magnetization in the additional reference layer.

10. The magnetic memory cell of claim 9, wherein the additional spacer layer is ruthenium.

11. The magnetic memory cell of claim 9, wherein the additional spacer layer is copper.

12. The magnetic memory cell of claim 9, wherein the additional spacer layer is chromium.

13. The magnetic memory cell of claim 9, wherein the reference layer has a thickness which is substantially equal to a thickness of the additional reference layer plus a thickness of the layer of magnetic material.

14. A magnetic memory comprising an array of magnetic memory cells each comprising:

sense layer;

reference layer coupled to the sense layer through a barrier layer;

additional reference layer coupled to the sense layer through a spacer layer such that a set of demagnetization and coupling fields from the additional reference layer balance a set of demagnetization and coupling fields from the reference layer.

15. The magnetic memory of claim 14, wherein the additional reference layers in the magnetic memory cells have a thickness which is preselected such that the demagnetization and coupling fields from the additional reference layers balance the demagnetization and coupling fields from the corresponding reference layers.

16. The magnetic memory of claim 14, wherein each magnetic memory cell further comprises a layer of antiferromagnetic material that pins an orientation of magnetization in the corresponding reference layer.

17. The magnetic memory of claim 16, wherein the additional reference layers comprise a permanent magnetic material having an orientation of magnetization substantially opposite to the orientation of magnetization in the reference layers.

18. The magnetic memory of claim 16, wherein each magnetic memory cell further comprises a layer of antiferromagnetic material that pins the orientation of magnetization in the corresponding additional reference layer substantially opposite to the orientation of magnetization in the corresponding reference layer.

19. The magnetic memory of claim 14, wherein the spacer layers comprise an insulating material having a thickness of less than 10 nanometers.

20. The magnetic memory of claim 14, wherein the spacer layers comprise a layer of conductor material.

21. The magnetic memory of claim 14, wherein the barrier layers comprise a layer of insulating having a thickness of less than 10 nanometers.

22. The magnetic memory of claim 14, wherein each magnetic memory cell further comprises:

a layer of antiferromagnetic material that pins the an orientation of magnetization in the corresponding additional reference layer;

a layer of magnetic material separated from the corresponding reference layer by an additional spacer layer;

a layer of antiferromagnetic material that pins an orientation of magnetization in the corresponding layer of magnetic material substantially parallel to the orientation of magnetization in the corresponding additional reference layer.

23. The magnetic memory of claim 22, wherein the additional spacer layers comprise ruthenium.

24. The magnetic memory of claim 22, wherein the additional spacer layers comprise copper.

25. The magnetic memory of claim 22, wherein the additional spacer layers comprise chromium.

26. The magnetic memory of claim 22, wherein the reference layers have a thickness which is substantially equal to a thickness of the additional reference layers plus a thickness of the layers of magnetic material.

* * * * *